(12) United States Patent
Alley et al.

(10) Patent No.: US 8,373,586 B2
(45) Date of Patent: Feb. 12, 2013

(54) CONFIGURABLE ANALOG INPUT CIRCUIT

(75) Inventors: Daniel Milton Alley, Earlysville, VA (US); Ye Xu, Shanghai (CN)

(73) Assignee: General Electric Company, Schenectady, NY (US)

(*) Notice: Subject to any disclaimer, the term of this patent is extended or adjusted under 35 U.S.C. 154(b) by 284 days.

(21) Appl. No.: 12/942,643

(22) Filed: Nov. 9, 2010

(65) Prior Publication Data

US 2011/0231157 A1    Sep. 22, 2011

Related U.S. Application Data

(63) Continuation-in-part of application No. 12/726,763, filed on Mar. 18, 2010, now Pat. No. 8,009,078.

(51) Int. Cl.
    *H03M 1/12* (2006.01)
(52) U.S. Cl. ............... 341/155; 379/403; 379/93.29; 379/93.31; 375/355; 716/122; 716/132; 381/120; 327/91; 327/337; 327/108; 327/436; 326/62; 326/110
(58) Field of Classification Search ............ 341/155; 326/38, 41, 62, 110; 327/91, 337, 108, 436; 702/187; 716/122, 132; 381/120; 375/355; 379/403, 93.29, 93.31
See application file for complete search history.

(56) References Cited

U.S. PATENT DOCUMENTS

| | | | | | |
|---|---|---|---|---|---|
| 5,083,288 | A | * | 1/1992 | Somlyody et al. | 702/116 |
| 5,107,146 | A | * | 4/1992 | El-Ayat | 326/41 |
| 5,563,526 | A | * | 10/1996 | Hastings et al. | 326/37 |
| 6,397,322 | B1 | * | 5/2002 | Voss | 712/35 |
| 6,639,433 | B1 | * | 10/2003 | Heckenbach | 327/108 |
| 6,981,090 | B1 | * | 12/2005 | Kutz et al. | 710/317 |
| 7,088,818 | B2 | * | 8/2006 | Prendergast et al. | 379/403 |
| 7,149,316 | B1 | * | 12/2006 | Kutz et al. | 381/120 |
| 7,223,014 | B2 | * | 5/2007 | Lojen | 374/120 |
| 7,350,164 | B2 | * | 3/2008 | Xu et al. | 716/122 |
| 7,869,275 | B2 | * | 1/2011 | Grant et al. | 365/185.08 |
| 8,009,078 | B1 | * | 8/2011 | Alley | 341/155 |
| 8,258,850 | B1 | * | 9/2012 | Pagnanelli et al. | 327/337 |

* cited by examiner

*Primary Examiner* — Lam T Mai
(74) *Attorney, Agent, or Firm* — Sutherland Asbill & Brennan LLP

(57) ABSTRACT

Configurable analog input circuits are provided. An analog input circuit may include a plurality of configurable input channels, at least one analog-to-digital converter, and at least one processor. Each input channel may include a plurality of switches utilized to select a type of input signal received via the input channel and a set of input terminals selectively utilized to correspond with the selected type of input signal. The at least one analog-to-digital converter may be configured to convert, for each of the plurality of input channels, the selected type of input signal into a digital output. The at least one processor may be configured to control operation of the plurality of switches associated with each of the plurality of configurable input channels.

20 Claims, 3 Drawing Sheets

| Input Type | Terminal 1 RTD1/+ | Terminal 2 RTD2/− | Terminal 3 RTD3 | Channel Switching | Measurement |
|---|---|---|---|---|---|
| Thermocouple | Sense V1 | Sense V2 | disconnected | Matrix connects burnout sources, A/D#1, A/D#2 | Thermocouple voltage = PGA*(V2−V1) Temperature may be determined with a table lookup |
| RTD | Current I1 to RTD, Sense V1 | Current I2 to RTD, Sense V2 | Return Current I1+I2, Sense V3 | Matrix connects current sources, A/D#1, A/D#2 | RTD Resistance = 2*R*PGA*(V1−V2)/V3 |
| Current | 24V loop supply | GND loop return | Current input, Sense V3 | Matrix connects 24V to T1, Gnd to T2, A/D#2 to T3 | mA = V3/R (current sensing resistor) |
| Voltage | Sense V1 | Sense V2 | disconnected | Matrix connects A/D#1, A/D#2 | V = PGA*(V1−V2) |

FIG. 3

CONFIGURABLE ANALOG INPUT CIRCUIT

CROSS-REFERENCE TO RELATED APPLICATION

This application is a continuation-in-part of co-pending U.S. patent application Ser. No. 12/726,763, filed Mar. 18, 2010, and entitled CONFIGURABLE ANALOG INPUT CHANNEL WITH GALVANIC ISOLATION, the contents of which are incorporated herein by reference in their entirety.

FIELD OF THE INVENTION

Embodiments of the invention relate generally to systems for sensing analog control data, and more particularly, to universal analog input circuits that are configurable to sense different analog input types.

BACKGROUND OF THE INVENTION

Control systems are utilized in a wide variety of different applications. For example, control systems are utilized to monitor power stations, turbines, and the like. In relatively complex control systems, it is typically necessary to monitor or sense a variety of different types of input signals, such as thermocouple inputs, resistance temperature detectors ("RTDs"), currents, voltages, and resistances. In conventional control systems, different types of sensing modules are typically employed to sense different types of input. A common approach is to utilize sensing modules that have a fixed number of input channels (e.g., 24 channels) for receiving a particular type of input. For instance, a first set of dedicated sensing modules are utilized for sensing thermocouple inputs, a second set of dedicated sensing modules are utilized for sensing RTD inputs, etc.

However, because each conventional sensing module is manufactured with a standard number of dedicated input channels, it is likely that channels of the sensing module will be unused once the module is deployed. Accordingly, improved analog input circuits are desirable.

BRIEF DESCRIPTION OF THE INVENTION

Some or all of the above needs and/or problems may be addressed by certain embodiments of the invention. Embodiments of the invention may include configurable analog input circuits. According to one embodiment of the invention, there is disclosed an analog input circuit. The analog input circuit may include a plurality of configurable input channels, at least one analog-to-digital converter, and at least one processor. Each input channel may include a plurality of switches utilized to select a type of input signal received via the input channel and a set of input terminals selectively utilized to correspond with the selected type of input signal. The at least one analog-to-digital converter may be configured to convert, for each of the plurality of input channels, the selected type of input signal into a digital output. The at least one processor may be configured to control operation of the plurality of switches associated with each of the plurality of configurable input channels.

According to another embodiment of the invention, there is disclosed another analog input circuit. The input circuit may include a plurality of configurable input channels, an analog-to-digital converter component, a multiplexer, and at least one processor. Each input channel may include a plurality of input terminals utilized to receive an analog input signal and a plurality of switches utilized to select a signal input type corresponding to the received input signal. The analog-to-digital converter component may be configured to convert the analog input signals received via each of the plurality of input channels into respective digital output. The multiplexer may be configured to receive the analog input signals from the plurality of input channels and selectively provide the analog input signals to the analog-to-digital converter component. The at least one processor may be configured to control operation of the multiplexer and the plurality of switches associated with each of the plurality of input channels.

Additional systems, methods, apparatus, features, and aspects are realized through the techniques of various embodiments of the invention. Other embodiments and aspects of the invention are described in detail herein and are considered a part of the claimed invention. Other embodiments and aspects can be understood with reference to the description and the drawings.

BRIEF DESCRIPTION OF THE DRAWINGS

Figure 1:
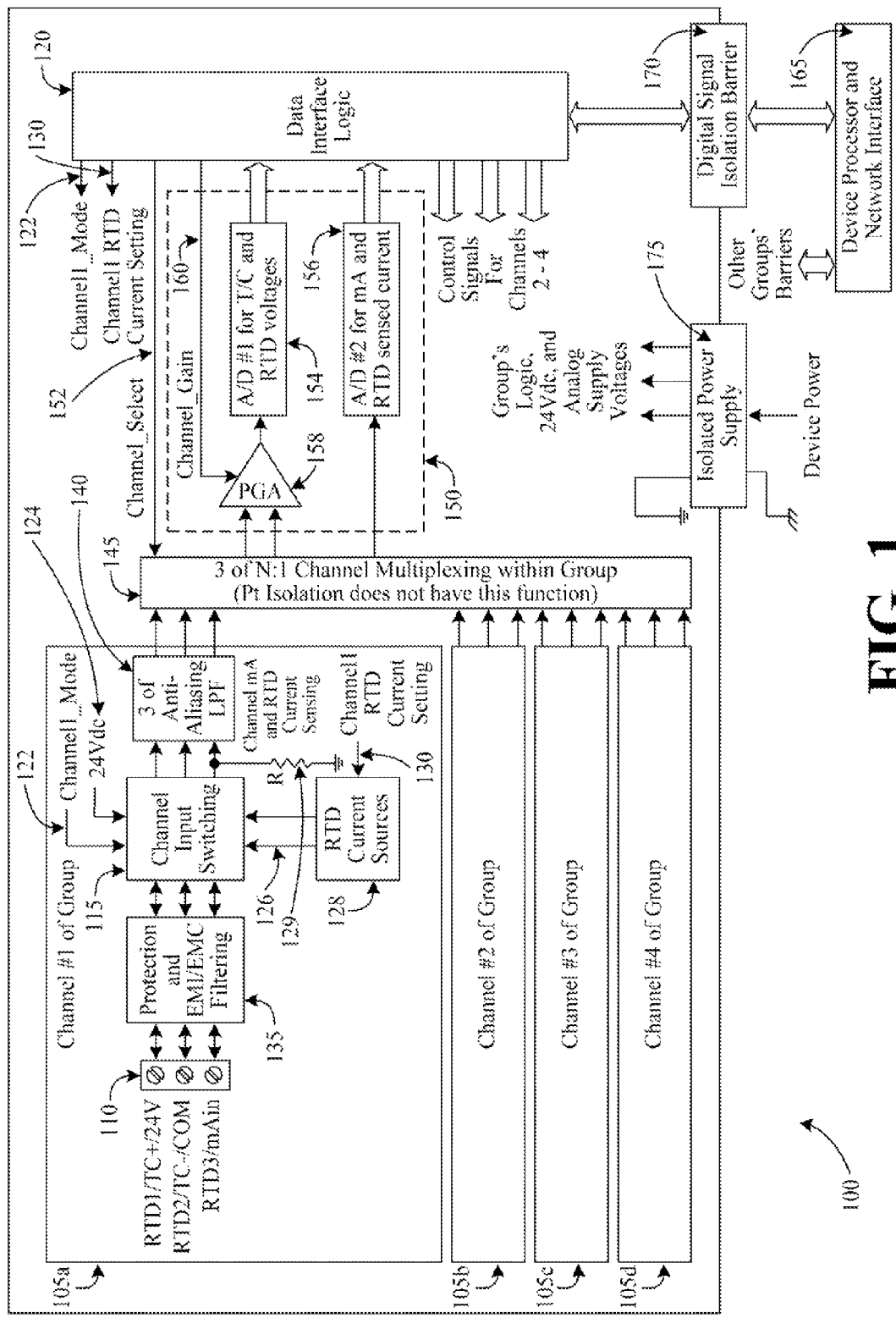

Having thus described the invention in general terms, reference will now be made to the accompanying drawings, which are not necessarily drawn to scale, and wherein:

FIG. 1 is a schematic diagram of an example universal input circuit, according to an illustrative embodiment of the invention.

Figure 2:
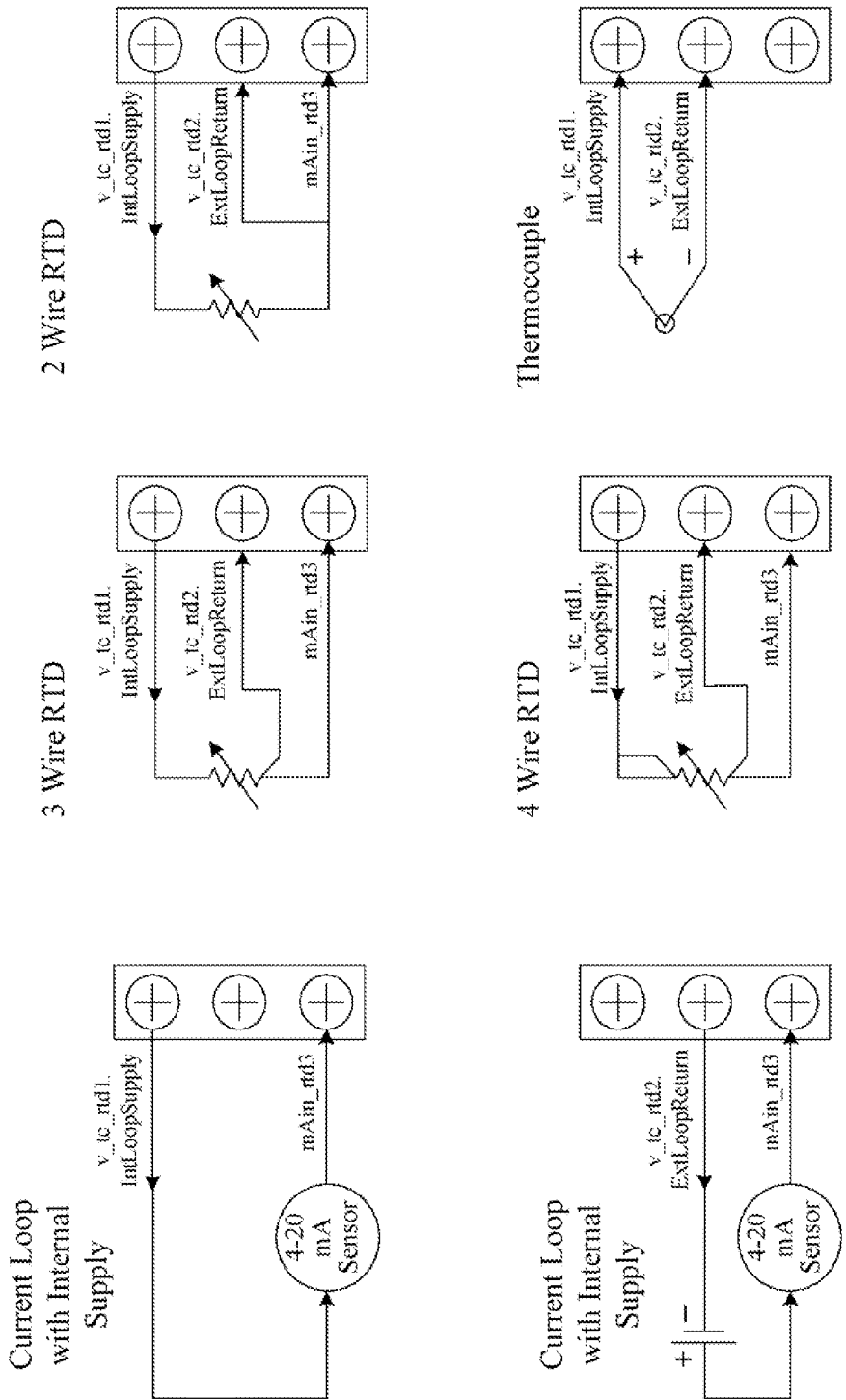

FIG. 2 is a schematic diagram of example input connections that may be associated with a universal input circuit, according to an illustrative embodiment of the invention.

FIG. 3 is a table of example input types and internal flows of an example universal input circuit, according to an embodiment of the invention.

DETAILED DESCRIPTION OF THE INVENTION

Illustrative embodiments of the invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

Disclosed are universal analog input circuits that may be utilized to selectively receive a variety of different input types. According to one example embodiment, an input circuit may include a plurality of configurable input channels, at least one analog-to-digital converter, and at least one processor. Any number of configurable input channels may be provided as desired, such as four, eight, or sixteen input channels. Additionally, as desired, the input channels may be organized into groups or sets. For example, sixteen input channels may be provided, and the channels may be divided into eight groups of two input channels, four groups of four input channels, or other groups. As desired, the input channels within each group may share or utilize other components of the input circuit, such as an analog-to-digital converter, an amplification component, and/or a multiplexer.

According to an aspect of the invention, each input channel may include a plurality of switches utilized to select a type of input signal received via the input channel. Additionally, each input channel may include a set of input terminals selectively utilized to correspond with the selected type of input signal. Control signals may be provided to the channel input switches by the at least one processor to select a type of input signal received via the input channel. In this regard, each input channel may be individually configured to receive a wide variety of different types of input signals, such as a voltage input, a thermocouple input, a current input, or a resistance temperature detector ("RTD") input. Each input channel may include any number of input terminals. For example, in certain embodiments, each input channel may include three input terminals that facilitate the receipt of various types of analog inputs.

The at least one analog-to-digital converter may be configured to receive analog data or an analog input from each of a plurality of input channels, such as input channels that are included within a group of channels. The analog-to-digital converter may additionally convert received analog data or input into digital data that is provided to the at least one controller. Any number of analog-to-digital converters may be utilized as desired in various embodiments. For example, in certain embodiments, two analog-to-digital converters may be utilized with a first analog-to-digital converter configured to convert received voltage values and a second analog-to-digital converter configured to convert received current values. As desired, a programmable gain amplifier may be configured to process one or more signals that are provided to the first analog-to-digital converter. Additionally, in certain embodiments, a multiplexer or other suitable switching component may be configured to receive analog input from the plurality of input channels and selectively provide the analog input to the at least one analog-to-digital converter.

The at least one processor may be configured to control the operation of the plurality of switches associated with each of the plurality of configurable input channels. Additionally, as desired, the at least one processor may control the operation of a multiplexer or switching component that provides analog data to the analog-to-digital converter(s). Once analog input has been converted to digital input, the at least one processor may receive the digital input. As desired, the at least one processor may process received input and/or provide at least a portion of the received input to one or more external devices, such as a device controller or a central controller associated with a control system. In certain embodiments, the input circuit may include a digital isolation barrier configured to electrically isolate the digital output. Additionally, the input circuit may include an isolated power supply configured to provide a reference voltage to the input circuit and/or various components of the input circuit.

Various embodiments of the invention may include one or more special purpose computers, systems, and/or particular machines that facilitate the receipt, processing, and/or output of analog data. A special purpose computer or particular machine may include a wide variety of different software modules and/or computer-implemented or computer-executable instructions as desired in various embodiments. As explained in greater detail below, in certain embodiments, these various software components may be utilized to facilitate the operation of an input circuit and/or the processing of received analog data.

Certain embodiments of the invention described herein may have the technical effect of facilitating receipt of different types of analog inputs by a universal input circuit. Additionally, certain embodiments of the invention may have the technical effect of facilitating the processing and/or output of one or more received input signals. In this regard, a flexible analog input circuit may be provided and unused analog input channels may be reduced or avoided.

FIG. 1 is a schematic diagram of one example universal input circuit 100 that may be utilized in accordance with various embodiments of the invention. The input circuit 100 may include any number of input channels, such as the channels 105a, 105b, 105c, 105d illustrated in FIG. 1. As desired, the input channels may be formed into one or more groups. A group of input channels, such as channels 105a-d, may share common downstream components, such as a multiplexing component and/or an analog-to-digital conversion component. Any number of groups of input channels may be included in an input circuit 100. Additionally, any number of input channels may be included in each group. For example, with an input circuit 100 containing sixteen input channels, the channels may be arranged into four groups of four input channels, two groups of eight input channels, eight groups of two input channels, etc. Alternatively, as desired, the sixteen input channels may be isolated input channels that are not grouped together.

An example input channel (referred to as input channel 105) will now be described. The input channel 105 may be a configurable input channel capable of receiving different types of input signals. With reference to FIG. 1, the input channel 105 may include a set of input terminals 110 configured to receive analog inputs, such as analog sensor inputs associated with the operation of a turbine or other machine. Any number of input terminals 110 may be associated with an input channel 105. For example, as illustrated in FIG. 1, three input terminals 110 may be associated with the input channel 105. In certain embodiments of the invention, the input channel 105 may be configurable to receive one of a thermocouple input, a RTD input, a current input (or current loop input), or a voltage input.

The input channel 105 may additionally include a switching component 115 that facilitates the selection of an input signal type by the input channel 105. As desired, the switching component 115 may include any number of switches that may be selectively actuated to select a desired input signal type. Additionally, in certain embodiments, operation of the switching component 115 and/or actuation of the switches may be controlled by a suitable controller 120 associated with the input circuit 100. For example, the controller 120 may provide a channel mode signal 122 to the switching component 115. Based at least in part upon the received channel mode signal, the switching component 115 may actuate one or more switches in order to select a desired input signal type. With continued reference to FIG. 1, the switching component 115 may additionally receive one or more reference signals, such as a voltage reference signal 124 (e.g., an approximately 24 VDC reference signal, etc.) and/or one or more RTD current source signals 126 received from one or more RTD current sources 128. As desired, at least one RTD current setting signal 130 may be provided to the RTD current source(s) 128 by the controller 120 in order to configure the RTD current source signals 126 that are provided to the switching component 115. The various operations of the switching component 115 that facilitate the selection of different input signals will be described in greater detail below.

As desired, a protection component 135 may be incorporated into the input channel 105. The protection component 135 may include suitable circuitry and/or other devices (e.g., diodes, transorbs, etc.) that facilitate the protection of other components of the input channel 105, such as components downstream of the input terminals 110 and/or the protection component 135. For example, the protection component 135 may prevent relatively high amplitude signals (e.g., voltage signals, current signals, etc.) from being provided to downstream components (e.g., an analog-to-digital converter) that may be damaged by the signals. As one example, suitable protection circuitry may prevent a 24 volt power signal from being provided to an analog-to-digital converter that is capable of processing voltage signals that have an amplitude of up to 2.5 volts.

Additionally, a filtering component 140 may be incorporated into the input channel 105. The filtering component 140 may facilitate the reduction of electrostatic discharge and/or electromagnetic interference within the input circuit 100. Additionally, the filtering component 140 may reduce aliasing within the input circuit 100. A wide variety of suitable filters may be utilized as desired in various embodiments of the invention, such as op amps that clamp the voltage levels that are provided to an analog-to-digital conversion component and/or a low pass anti-aliasing filter (e.g., a low pass filter having a rating of approximately 200 Hz, etc.)

The protection component 135 and the filtering component 140 are described above as separate components for ease in understanding. As desired, protection and/or filtering circuitry may be included throughout the input circuit 100. For example, protection and/or filtering circuitry may be integrated throughout the switching circuitry and analog-to-digital conversion component.

With continued reference to FIG. 1, the input circuit 100 may include a multiplexing component 145, an analog-to-digital conversion component 150, and/or a controller 120. The multiplexing component 145 may receive output signals from one or more input channels within a group of channels, such as channels 105a-d, and the multiplexing component 145 may selectively provide the received output signals to the analog-to-digital conversion component 150. In this regard, a single analog-to-digital conversion component 150 may be utilized in conjunction with a plurality of input channels. In operation, the multiplexing component 145 may receive a channel select signal 152 from the controller 120. Based upon the received channel select signal 152, the multiplexing component 145 may selectively provide signals received from the various input channels 105a-d to the analog-to-digital conversion component 150. For example, if the channel select signal 152 includes a designation for a first input channel 105a, then the multiplexing component 145 may provide signals received from the first input channel 105a to the analog-to-digital conversion component 150. In certain embodiments, the multiplexing component 145 may provide signals received from multiple input channels to the analog-to-digital conversion component 150. For example, if separate portions of the analog-to-digital conversion component 150 are utilized to convert input for two different input channels, then the multiplexing component 145 may be configured to provide signals received from the two input channels to independent components of the analog-to-digital conversion component 150.

The analog-to-digital conversion component 150 may be configured to convert received analog signals or values into digital data that may be provided to the controller 120. As desired, the analog-to-digital conversion component 150 may include a wide variety of different types of analog-to-digital converters, amplifiers, and/or other components. For example, with reference to FIG. 1, the analog-to-digital conversion component 150 may include a first analog-to-digital ("A/D") converter 154, a second A/D converter 156, and/or a programmable gain amplifier ("PGA") 158. In certain embodiments, the first A/D converter 154 may facilitate conversion of analog voltage values into digital voltage values. In this regard, voltage measurements, thermocouple measurements, and/or RTD voltages may be converted. As desired, voltage measurements may be modified by the PGA 158 prior to provision of the voltage measurements to the first A/D converter 154. The gain imparted by the PGA 158 may be established or adjusted based upon a channel gain signal 160 received from the controller 120. The second A/D converter 156 may facilitate conversion of analog current values into digital current values. In this regard, current measurements and/or RTD currents may be converted. Although the PGA 158 is illustrated as being associated with the first A/D converter 154, in certain embodiments, a PGA may alternatively be associated with the second A/D converter 154. In other embodiments, respective PGAs may be associated with each of the A/D converters. In yet other embodiments, the analog-to-digital conversion component 150 may not include any PGAs.

According to an aspect of the invention, the multiplexing component 145 and/or A/D conversion component 150 may be shared by a plurality of input channels, such as the channels 105a-d included in a group of channels. As desired, a plurality of channel groups may be included in an input circuit 100, and each channel group may include its own multiplexing component 145 and/or A/D conversion component 150.

The controller 120 may include any number of suitable processor-driven devices that control the operations of the input circuit 100. The controller may include, for example, any number of special purpose computers or particular machines, application-specific circuits, programmable logic controllers ("PLCs"), field programmable gate arrays ("FPGAs"), microcontrollers, personal computers, minicomputers, and the like. In certain embodiments, the controller 120 may include a suitable microcontroller or FPGA. In certain embodiments, the operations of the controller 120 may be controlled by computer-executed or computer-implemented instructions that are executed by one or more processors associated with the controller 120. The instructions may be embodied in one or more software components as desired in various embodiments of the invention. The execution of the instructions may form a special purpose computer or other particular machine that is operable to facilitate the operation of the input circuit 100, the selection of desired input signal types by the input channels associated with the input circuit, and/or the processing of data received by the analog-to-digital conversion components.

In certain embodiments, the controller 120 may include one or more processors, one or more memory devices, and/or one or more interface devices (e.g., input and/or output pins). The one or more memory devices may be any suitable memory devices, for example, caches, read-only memory devices, random access memory devices, flash memory devices, etc. The one or more memory devices may store data, executable instructions, and/or various program modules utilized by the controller 120, such as data files, an operating system, and/or control logic for the input circuit 100.

In operation, the controller 120 may control the scanning of the input channels associated with the input circuit, the receipt from one or more A/D conversion components of digital measurements data associated with the input channels, the processing of the received digital measurements data, and/or the output of measurements data and/or other messages to one or more external devices. Additionally, the controller 120 may control the configuration of the various input channels in order to select input signal types associated with the input channels. As one example, the controller 120 may provide respective channel mode signals to the various switching components of the input channels. In this regard, the controller 120 may configure each input channel to receive a particular input signal type (e.g., a voltage, thermocouple, current, or RTD input). Additionally, as desired, the controller 120 may provide a RTD current setting signal to one or more input channels in order to configure one or more RTD current sources associated with the input channels. Once one or more input channels have been configured, the controller 120 may communicate a channel select signal 152 to the multiplexing component 145 in order to select channel signals for provision to the A/D conversion component 150. In this regard, the controller 120 may selectively scan various input channels (e.g., scan in a loop or scan according to an algorithm) in order to receive measurements data associated with the input channels. As desired, the controller 120 may control the gain of a PGA 158 utilizing a channel gain signal 160.

Once a channel signal has been converted by the A/D conversion component 150, the converted data may be provided to the controller 120. As desired, the controller 120 may process the received data. For example, the controller 120 may calculate a resistance value for a RTD measurement utilizing a received voltage measurement and a received current measurement. As desired, the controller 120 may save received data and/or output received data for communication to and/or receipt by one or more external devices, such as an external device processor 165 and/or external device controller. According to an aspect of the invention, one or more digital isolation barriers 170 may provide galvanic or electrical isolation for the input channels. For example, a digital isolation barrier 170 may be provided for each group of input channels associated with the input circuit 100.

As desired, the controller 120 may configure an input channel 105 to receive a wide variety of different input signal types, such as a voltage input, a current input, a thermocouple input, or a RTD input. To facilitate receipt of different input signal types, a wide variety of different connections may be made to the terminals 110 of an input channel 105. FIG. 2 is a block diagram that illustrates a few example connections that may be made. With reference to FIG. 2, six example connection configurations are illustrated. These connections include a current loop connection that includes an internal power supply, a current loop connection that includes an external power supply, a three wire RTD connection, a four wire RTD connection, a two wire RTD connection, and a thermocouple connection. For each connection, example terminations between an external circuit and the input channel 105 are illustrated. A few of these example terminations are described in greater detail below. These example terminations are not intended to be limiting and are provided by way of example only.

With continued reference to FIG. 1, a wide variety of different input signal types may be received by an input channel 105. For example, in order to receive a current input, the channel mode may be set by the controller 120 to a current input signal type, such as a milliamp signal type. The reference voltage signal (e.g., 24 volt signal) for the input channel 105 may be connected or tied to the first input terminal of the channel 105, and the second or center input terminal may be tied to a ground return. In this regard, a burden resistor may be formed. A current signal may be received by the third input terminal of the channel 105, and the current signal (e.g., milliamp signal) may be passed through the switching component 115 and multiplexing component 145 (configured by a channel select signal 152) to the second A/D converter 156 of the A/D conversion component 150. As desired, a RTD current sensing resistor 129 may additionally be connected to the third input terminal. The second A/D converter 156 may be utilized to convert the current signal into digital data that is passed to the controller 120. The controller 120 may then process the received digital data in order to calculate the value of the current signal.

In order to receive or measure a thermocouple input, the channel mode may be set by the controller 120 to a thermocouple input signal type. Voltage inputs for a thermocouple signal may be connected to the first and second (or middle) terminals of the input channel 105, and the voltage inputs may be routed through the switching component 115 and multiplexing component 145 to the two inputs of the PGA 158. The third input terminal may remain unused. As desired, the PGA 158 may provide a gain to a voltage differential (e.g., V1−V2) based upon a channel gain signal 160, and the output of the KA 158 may be supplied to the first A/D converter 154. The first A/D converter 154 may be utilized to convert the voltage signal into digital data that is passed to the controller 120.

As desired, a RTD current source signal 126 may be switched in from a RTD current source 128 in order to bias the thermocouple input. In this regard, burnout detection for a thermocouple may be provided. For example, approximately 5 volt signals may be attached through respective mega ohm resistors to either side of the thermocouple. When the thermocouple is working properly and is connected properly, a voltage difference on the signal may be a relatively small value, such as a microvolt value. However, if the thermocouple has been burned open, then one side of the connection may be pulled to a relatively high value, such as a 4-5 volt value, and the other side of the connection may be pulled to ground.

Similar to the thermocouple input, in order to receive or measure a voltage input, the channel mode may be set by the controller 120 to a voltage input signal type. Voltage inputs may be connected to the first and second (or middle) terminals of the input channel 105, and the voltage inputs may be routed through the switching component 115 and multiplexing component 145 to the two inputs of the PGA 158. The third input terminal may remain unused. As desired, the PGA 158 may provide a gain to a voltage differential (e.g., V1−V2) based upon a channel gain signal 160, and the output of the PGA 158 may be supplied to the first A/D converter 154. The first A/D converter 154 may be utilized to convert the voltage signal into digital data that is passed to the controller 120.

As yet another example, in order to receive a RTD input, the channel mode may be set by the controller 120 to a RTD input signal type. A first voltage input for the RTD is connected to the first input terminal, and a current source is switched in from the RTD current sources 128 to the first input terminal. The value on the first input terminal is tied to one side of a variable resistor that changes its resistance based on temperature. The other side of the resistor may be connected to the second (or middle) input terminal, and a current source may be switched in to the second terminal. The third input terminal may then be connected to the RTD in order to measure a current associated with the RTD. The voltage across the upper two input terminals may be provided through the switching component 115 and multiplexing component 145 to the PGA 158 and first A/D converter 154, and a voltage value may be obtained. The current received at the third input terminal may be provided to the second A/D converter 156, and a current measurement may be obtained. The two values may then be divided by the controller 120 in order to determine a resistance value.

With continued reference to FIG. 1, the input circuit 100 may include one or more digital isolation barriers 170. For example, a digital isolation barrier 170 may be provided for each group of input channels. A digital isolation barrier 170 may provide galvanic and/or electrical isolation for the input channels from other components of the input circuit 100. Galvanic isolation is the principle of isolating functional sections of electrical systems so that charge-carrying particles cannot move from one section to another; i.e., there is no electric current flowing directly from one group of channels to the next. As desired, a wide variety of different types of isolation barriers may be utilized as desired in various embodiments of the invention, including but not limited to, optically coupled devices, inductively coupled devices, radio frequency coupled devices, and/or capacitance coupled devices.

Additionally, the input circuit 100 may include an isolated power supply 175 or power source, such as a discrete power supply. The power supply 175 may receive power from an external power source, and the power supply 175 may provide power signals and/or reference signals to other components of the input circuit 100. According to an aspect of the invention, an isolated power signal may be provided to each group of input channels included in the input circuit 100.

As desired, embodiments of the invention may include an input circuit 100 with more or less than the components illustrated in FIG. 1. The input circuit 100 of FIG. 1 is provided by way of example only.

FIG. 3 is a table 300 of example input types and internal flows of an example universal input circuit, according to an embodiment of the invention. The table 300 provides example configurations for different input types and illustrates example switching and measurements that may be associated with the different input types. Examples of the configurations illustrated in FIG. 3 are described in greater detail above with reference to FIG. 1.

The invention is described above with reference to various computer-executable instructions. These computer-executable program instructions may be loaded onto a microcontroller, a general purpose computer, a special-purpose computer, a processor, or other programmable data processing apparatus to produce a particular machine, such that the instructions that execute on the computer, processor, or other programmable data processing apparatus create means for implementing one or more specified functions. These computer program instructions may also be stored in a computer-readable memory that can direct a computer or other programmable data processing apparatus to function in a particular manner, such that the instructions stored in the computer-readable memory produce an article of manufacture including instruction means that implement one or more specified functions. As an example, embodiments of the invention may provide for a computer program product, comprising a computer usable medium having a computer-readable program code or program instructions embodied therein, said computer-readable program code adapted to be executed to implement one or more specified functions. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the specified functions.

While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. An input circuit comprising:
   a plurality of configurable input channels, each input channel comprising:
   a plurality of switches utilized to select a type of input signal received via the input channel; and
   a set of input terminals selectively utilized to correspond with the selected type of input signal;
   at least one analog-to-digital converter configured to convert, for each of the plurality of input channels, the selected type of input signal into a digital output; and
   at least one processor configured to control operation of the plurality of switches associated with each of the plurality of configurable input channels.

2. The input circuit of claim 1, further comprising:
   a digital isolation barrier configured to electrically isolate the digital output.

3. The input circuit of claim 1, further comprising:
   an isolated power supply configured to provide a reference voltage to the input circuit.

4. The input circuit of claim 1, further comprising:
   a switching component configured to receive, from each of the plurality of input channels, the selected type of input and selectively provide the received input to the at least one analog-to-digital converter.

5. The input circuit of claim 1, wherein the selected type of input signal comprises one of (i) a voltage input, (ii) a thermocouple input, (iii) a current input, or (iv) a resistance temperature detector input.

6. The input circuit of claim 1, wherein the set of terminals for each of the plurality of configurable input channels comprises three terminals.

7. The input circuit of claim 1, wherein the at least one analog-to-digital converter comprises:
   a first analog-to-digital converter utilized to convert received voltage values; and
   a second analog-to-digital converter utilized to convert received current values.

8. The input circuit of claim 7, further comprising:
   a programmable gain amplifier configured to process one or more signals provided to the first analog-to-digital converter.

9. The input circuit of claim 1, wherein the at least one processor is further configured to receive the digital output and provide information associated with the received digital output to at least one external device.

10. The input circuit of claim 1, wherein the plurality of configurable input channels comprises a first plurality of input channels, wherein the at least one analog-to-digital converter comprises a first set of analog-to-digital converters, the input circuit further comprising:
    a second plurality of configurable input channels, each of the second plurality of input channels configured to receive a selectable type of input signal; and
    a second set of analog-to-digital converters configured to convert, for each of the second plurality of input channels, a received input signal into a digital output, wherein the at least one processor is further configured to control the selectable type of input received by each of the second plurality of configurable input channels.

11. An input circuit comprising:
a plurality of configurable input channels, each input channel comprising:
a plurality of input terminals utilized to receive an analog input signal; and
a plurality of switches utilized to select a signal input type corresponding to the received input signal;
an analog-to-digital converter component configured to convert the analog input signals received via each of the plurality of input channels into respective digital output;
a multiplexer configured to receive the analog input signals from the plurality of input channels and selectively provide the analog input signals to the analog-to-digital converter component; and
at least one processor configured to control operation of the multiplexer and the plurality of switches associated with each of the plurality of input channels.

12. The input circuit of claim 11, wherein the at least one processor comprises a microcontroller.

13. The input circuit of claim 11, further comprising:
a digital isolation barrier configured to electrically isolate the digital output.

14. The input circuit of claim 11, further comprising:
an isolated power supply configured to provide a reference voltage to the input circuit.

15. The input circuit of claim 11, wherein the selected signal input type comprises one of (i) a voltage input, (ii) a thermocouple input, (iii) a current input, or (iv) a resistance temperature detector input.

16. The input circuit of claim 11, wherein the plurality of input terminals for each of the plurality of configurable input channels comprises three terminals.

17. The input circuit of claim 11, wherein the analog-to-digital converter component comprises:
a first analog-to-digital converter utilized to convert received voltage values; and
a second analog-to-digital converter utilized to convert received current values.

18. The input circuit of claim 17, further comprising:
a programmable gain amplifier configured to process one or more signals provided to the first analog-to-digital converter.

19. The input circuit of claim 11, wherein the at least one processor is further configured to receive the digital output and provide information associated with the received digital output to at least one external device.

20. The input circuit of claim 11, wherein the plurality of configurable input channels comprises a first plurality of input channels, wherein the analog-to-digital converter component comprises a first analog-to-digital converter component, the input circuit further comprising:
a second plurality of configurable input channels, each of the second plurality of input channels configured to receive a selectable type of input signal; and
a second analog-to-digital converter component configured to convert, for each of the second plurality of input channels, a received input signal into a digital output,
wherein the at least one processor is further configured to control the selectable type of input received by each of the second plurality of configurable input channels.

* * * * *